ically denoted by Patent number 4,286,047 — title page.

United States Patent [19]

Bennett et al.

[11] 4,286,047
[45] Aug. 25, 1981

[54] PRESSURE-SENSITIVE ADHESIVE SUSCEPTIBLE TO ULTRAVIOLET LIGHT-INDUCED DETACKIFICATION

[75] Inventors: Richard E. Bennett, Hudson, Wis.; Mary A. Hittner, Little Canada, Minn.

[73] Assignee: Minnesota Mining and Manufacturing Company, St. Paul, Minn.

[21] Appl. No.: 60,276

[22] Filed: Jul. 25, 1979

[51] Int. Cl.³ .............................................. G03C 1/68
[52] U.S. Cl. .............................. 430/280; 204/159.18; 156/272; 156/330; 156/344
[58] Field of Search ................... 430/280; 204/159.18; 156/272, 330, 344

[56] References Cited

U.S. PATENT DOCUMENTS

| | | | |
|---|---|---|---|
| 3,222,419 | 12/1965 | Jubilee et al. | 260/836 |
| 3,280,217 | 10/1966 | Lader et al. | 260/844 |
| 3,284,423 | 11/1966 | Knapp | 260/80.5 |
| 3,563,953 | 2/1971 | Lehmann et al. | 260/63 |
| 3,579,490 | 5/1971 | Kordzinski | 260/80.72 |
| 3,729,338 | 4/1973 | Lehmann et al. | 117/122 |
| 3,893,982 | 7/1975 | Gardner et al. | 260/78.5 R |
| 3,903,057 | 9/1975 | Gardner et al. | 260/78.5 T |
| 3,981,897 | 9/1976 | Crivello | 260/440 |
| 3,998,997 | 12/1976 | Mowdood et al. | 526/271 |
| 4,026,705 | 5/1977 | Crivello et al. | 204/159.18 |
| 4,054,451 | 10/1977 | Schlesinger et al. | 430/280 |
| 4,058,401 | 11/1977 | Crivello | 204/159.18 |
| 4,069,055 | 1/1978 | Crivello | 204/159.18 |
| 4,074,008 | 2/1978 | Green | 428/418 |
| 4,081,276 | 3/1978 | Crivello | 430/280 |
| 4,090,936 | 5/1978 | Barton | 204/159.18 |
| 4,108,747 | 8/1978 | Crivello | 204/159.18 |
| 4,113,792 | 9/1978 | Pastor et al. | 260/834 |
| 4,156,035 | 5/1979 | Tsao et al. | 427/44 |
| 4,169,732 | 10/1979 | Shipley | 430/280 |
| 4,173,476 | 11/1979 | Smith | 430/280 |

FOREIGN PATENT DOCUMENTS 994243  6/1965  United Kingdom .

OTHER PUBLICATIONS

Patrick, *Treatise on Adhesion and Adhesives*, vol. 2, pp. 219–220.

*Primary Examiner*—Jack P. Brammer
*Attorney, Agent, or Firm*—Cruzan Alexander; Donald M. Sell; Richard E. Brink

[57] ABSTRACT

"Release on demand" pressure-sensitive adhesives and tapes which are readily detackifiable by exposure to actinic radiation. The adhesive system has an oxirane ring-bearing component blended thereinto (or preferably reacted therewith) to achieve an adhesive epoxy equivalent value of 400–900, preferably 450–700. The adhesive system also includes an effective amount of ionic photoinitiator capable of promoting the polymerization of oxirane rings.

10 Claims, No Drawings

PRESSURE-SENSITIVE ADHESIVE SUSCEPTIBLE TO ULTRAVIOLET LIGHT-INDUCED DETACKIFICATION

BACKGROUND OF THE INVENTION

This invention relates to normally tacky and pressure-sensitive adhesive and to tape made therewith.

Pressure-sensitive adhesive tapes form a large and versatile family used in such diverse fields as masking, mounting, holding, mending, etc. In many instances, it is desired to have the tape remain permanently adhered in place. In other cases, however, it is extremely desirable to have the tape remain firmly bonded to a substrate only until it has ceased to perform its intended function, e.g., masking purposes during a painting operation, supporting a silicon wafer during specific finishing operations, protecting highly polished glass or metal surfaces, etc. Generally speaking, however, the longer a tape is in contact with a given substrate, the more firmly it adheres. It is believed that there has never previously existed a tape which would remain firmly bonded to any of a variety of substrates for long periods of time and yet be capable of having its adhesion to the substrate quickly reduced when it was desired to remove the tape. The present invention provides such a product.

SUMMARY

The invention comprises a normally tacky and pressure-sensitive adhesive having an epoxy equivalent value of about 400-900 (preferably 450-700) and containing an effective amount of ionic photoinitiator capable of promoting the polymerization of oxirane rings. The epoxy functionality can be introduced into the adhesive by one or both of two techniques, the preferred way being to form a tacky rubbery polymer of monomers consisting essentially of (1) about 65-80 weight percent polymer of a monomer system which can be polymerized per se to a tacky, rubbery state and (2) correspondingly about 35-20 weight percent of oxirane ring-containing monomers selected from the class consisting of glycidyl acrylate, glycidyl methacrylate and glycidyl allyl ether. The second way in which the epoxy functionality can be introduced is to blend appropriate amounts of any epoxy resin into an otherwise conventional pressure-sensitive adhesive. The first method is generally preferred, since the adhesive remains stable over a considerable period of time; in contrast, blends of epoxy resins and pressure-sensitive adhesives are not usually compatible and tend to separate upon standing. Where the adhesive is to be coated on a sheet backing soon after formulation, however, the problem of incompatibility is minimized. It has also been found that actinic irradiation of a pressure-sensitive adhesive lowers the adhesion value more when the adhesive contains a co-reacted epoxy monomer than when the epoxy is merely blended into the adhesive.

Many photoinitiators are known to promote the polymerization of epoxides. Among the most effective are the radiation-sensitive aromatic onium salts of group Va and VIa as respectively disclosed in U.S. Pat. Nos. 4,069,055 and 4,058,401, certain diaryl halonium salts containing group Va metal hexafluorides as disclosed in U.S. Pat. No. 3,981,897, certain onium catalysts of Groups Va, VIa and VIIa atoms as disclosed in U.S. Pat. No. 4,101,513, and triarylsulfonium complex salts of the formula

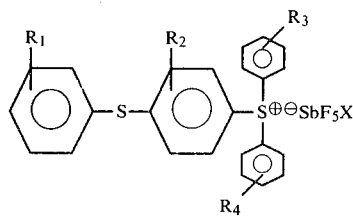

where X is F or OH and $R_1$, $R_2$, $R_3$ and $R_4$ are each selected from H, lower alkyl, alkoxy or halogen.

Sources of ultraviolet light are, of course, well known, including, e.g., germicidal lamps and low intensity black lights; a detailed discussion of light sources suitable for practicing the present invention is included in U.S. Pat. No. 4,058,401. While the onium salt photoinitiators useful in the invention are per se photosensitive only in the ultraviolet portion of the electromagnetic spectrum, they can be rendered effective in the near ultraviolet and visible portions of the spectrum by incorporating sensitizing agents such as 2-ethyl-9,10-dimethoxyanthracene and 9,10-diethoxyanthracene; cf., e.g., U.S. Pat. No. 4,069,054.

It is recognized that others have incorporated epoxy functionality in pressure-sensitive adhesives by reacting 0.1-15 weight percent glycidyl acrylate, glycidyl methacrylate, or glycidyl allyl ether into the pressure-sensitive adhesives; see, e.g., U.S. Pat. Nos. 3,284,423, 3,563,953, 3,579,490, 3,729,338, 3,893,982, and 3,998,997. Expressed in another way, this art suggests the preparation of pressure-sensitive adhesives having epoxy equivalent values on the order of 950-150,000. In many instances, the stated purpose for incorporating epoxy functionality in the pressure-sensitive adhesive was to make the adhesives more effective in bonding to a substrate, an object that is essentially diametrically opposite to that of the present invention. In any event, none of these patents suggests either the unusually high level of epoxy functionality utilized in the present invention (actually teaching that high levels should be avoided, cf., U.S. Pat. No. 3,563,953) or the controlled release of adhesion by exposure to ultraviolet light.

PRESENTLY PREFERRED EMBODIMENTS

To simplify the presentation of tabulated examples, the following abbreviations have been adopted:

| Abbreviation | Substance |
|---|---|
| | Oxirane Ring-Containing Substances |
| GA | Glycidyl acrylate |
| GAE | Glycidyl allyl ether |
| GMA | Glycidyl methacrylate |
| E332 | Diglycidyl ether of bisphenol A, having an epoxy equivalent weight of 172-176, commercially available from Dow Chemical Company under the trade designation "DER 332". |
| E7818 | Experimental epoxy resin having the structural formula $$HC\underset{\diagdown\;\diagup}{\overset{H}{\rule{0pt}{1ex}}}\underset{O}{\rule{0pt}{1ex}}\overset{H}{\underset{\;}{C}}-\overset{H}{\underset{H}{C}}-O\diagdown\underset{R}{\rule{0pt}{1ex}}\diagup O-\overset{H}{\underset{H}{C}}-\overset{H}{\underset{\;}{C}}\underset{\diagdown\;\diagup}{\overset{H}{\rule{0pt}{1ex}}}\underset{O}{\rule{0pt}{1ex}}CH \text{ and}$$ an epoxy equivalent weight of 165, commercially available from Dow Chemical Company under the trade |

| Abbreviation | Substance |
|---|---|
| | designation "XD 7818". |
| | Co-Reacting Monomers |
| AA | acrylic acid |
| BA | n-butyl acrylate |
| 2-EHA | 2-ethyl hexyl acrylate |
| HEA | hydroxyethyl acrylate |
| IOA | iso-octyl acrylate |
| LA | lauryl acrylate |
| OA | n-octyl acrylate |
| | Photoinitiators |
| $\phi_2IAsF_6$ | diphenyliodonium hexafluoroarsenate |
| $\phi_2IPF_6$ | diphenyliodonium hexafluorophosphonate |
| $(CH_3\phi)_2ISbF_6$ | ditoluyliodonium hexafluoroantimonate |
| $\phi_3SSbF_5OH$ | triphenylsulfonium hydroxypentafluoroantimonate |
| $\phi_3SSbF_6$ | triphenylsulfonium hexafluoroantimonate |
| $\phi_2SSbF_6$ $\mid$ $\phi S\phi$ | diphenylphenylthiophenyl hexafluoroantimonate |
| $\phi_2S-SbF_6$ $\mid$ $\phi Cl$ | 4-chlorophenyldiphenyl hexafluoroantimonate |
| | Tackifying Resin |
| S115 | Poly-beta-pinene having a ring-and-ball softening point of approximately 115° C., commercially available from Hercules, Inc. under the registered trademark designation "Piccolyte" S115. |
| | Solvent |
| EtOAc | ethyl acetate |
| iPrOH | iso-propanol |

Understanding of the invention will be enhanced by referring to the subsequent examples, in which all parts are by weight unless otherwise noted.

To prepare the adhesive for each example shown in Table I, a glass bottle was charged with the indicated amounts of the various components, purged thoroughly with nitrogen, capped, placed in a rotating water bath, and tumbled. In Examples 1 and 2, the time of reaction was 24 hours; in all other examples, reaction time was 18 hours. The water bath temperature was 58° C. in Example 1, 53° C. in Examples 2 and 3, and 54° C. in all other cases. The reaction mixture of Example 14 contained 0.4 part benzoyl peroxide as a polymerization initiator; all other examples in Table I included 0.25 part of 2,2'-azo-bis(isobutyronitrile) for this purpose. The reaction mixture of Examples 2, 4, 6, 7 and 15 also included 0.5–1.0 part dodecyl mercaptan, which, like iso-propanol, functions as a chain transfer agent.

Into each of the adhesives of Table I was then blended 3 parts by weight of a

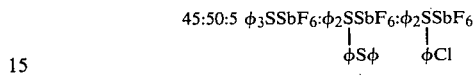

photoinitiator mixture, generally as 10–50% solids solutions in ethyl acetate, methyl ethyl ketone, methylene chloride or other solvent to facilitate the development of a uniform blend. (For further details regarding photoinitiator systems of this type, see copending application Ser. No. 876,114, filed Feb. 8, 1978, assigned to the assignee of the present invention.) Each adhesive was then coated on one face of a 38-micrometer biaxially oriented polyethylene terephthalate foil and the solvent evaporated to leave a dried deposition product weighing approximately 33 g/m². The resultant pressure-sensitive adhesive tape was evaluated by applying a 25.4-mm×12.7-mm strip to a desired panel, doubling one end of the adhesive strip back over itself at 180°, and measuring the force required to peel the tape from the substrate at a rate of 30.5 cm/minute. (Further details of this test are shown in "Test Methods for Pressure Sensitive Tapes", available from the Specifications and Technical Committee of the Pressure-Sensitive Tape Council, 1201 Waukegan Road, Glenview, IL 60025, under the test designation PSTC-1.) An identically prepared sample was then exposed, through the foil backing, to a total flux ranging from 0.2 to 1.5 joules of ultraviolet radiation (185–400 nm) emitted by a 118 watts/cm iron halide doped mercury vapor lamp. In the table, adhesives which have been exposed in this manner are termed "cured".

TABLE I

| | Reactive Monomers | | | | Solvent | | Epoxy Equivalent Weight of Adhesive Solids | Adhesion to glass, g/cm width | |
|---|---|---|---|---|---|---|---|---|---|
| | Epoxy | | Other | | | | | Before | After |
| Example | Type | Parts | Type | Parts | Type | Parts | | UV Cure | UV Cure |
| 1 | GMA | 25 | IOA | 75 | EtOAc iPrOH | 90 60 | 570 | 440 | 22 |
| 2 | GMA | 30 | IOA | 70 | EtOAc iPrOH | 75 75 | 475 | 363 | 13 |
| 3 | GMA GA | 10 10 | IOA | 80 | EtOAc iPrOH | 124 26 | 675 | >792* | 55 |
| 4 | GMA | 20 | LA | 80 | EtOAc | 150 | 710 | 143 | 1–10 |
| 5 | GMA | 20 | 2-EHA | 80 | EtOAc iPrOH | 60 90 | 710 | 330 | 1–10 |
| 6 | GMA | 20 | BA | 80 | EtOAc | 230 | 710 | 418 | 1–10 |
| 7 | GMA | 30 | BA | 70 | EtOAc iPrOH | 75 75 | 475 | 462 | 1–10 |
| 8 | GMA | 20 | 2-EHA | 80 | EtOAc iPrOH | 120 30 | 710 | >308* | 1–10 |
| 9 | GA | 20 | BA | 80 | EtOAc iPrOH | 135 15 | 710 | >792* | 1–10 |
| 10 | GA | 40 | BA | 60 | EtOAc iPrOH | 113 37 | 350 | >418* | 110 |
| 11 | GAE | 20 | BA | 80 | EtOAc | 150 | 570 | >55* | 75 |
| 12 | GMA | 20 | HEA IOA | 2 78 | EtOAc iPrOH | 75 75 | 710 | 213 | 22 |
| 13 | GMA | 25 | IOA | 75 | EtOAc iPrOH | 90 60 | 475 | 572 | 1–10 |
| 14 | GMA | 20 | OA | 80 | EtOAc | 90 | 710 | 77 | 1–10 |

TABLE I-continued

| | Reactive Monomers | | | | Solvent | | Epoxy Equivalent Weight of | Adhesion to glass, g/cm width | |
|---|---|---|---|---|---|---|---|---|---|
| | Epoxy | | Other | | | | | Before | After |
| Example | Type | Parts | Type | Parts | Type | Parts | Adhesive Solids | UV Cure | UV Cure |
| 15 | GMA | 20 | LA | 80 | iPrOH<br>EtOAc | 60<br>150 | 710 | 143 | 1-10 |

*Adhesive layer split during test; value reported is, in effect the cohesive strength of the adhesive.

The following table shows the importance of the epoxy equivalent weight of the adhesive copolymer. All examples are IOA:GMA copolymers, prepared in the same manner as previously described, employing various EtOAc:iPrOH blends as the solvent system. Into the adhesive was blended the same type and amount of photoinitiator used in the previous examples. Adhesion to each of the following substrates was measured substantially as in the test previously described.

| | |
|---|---|
| Glass | 4.8-mm soda-lime window glass, cleaned by wiping with heptane |
| Aluminum | Type 3003-H14, 0.787-mm sheet, rolled finish |
| Printed circuit board laminate | Epoxy resin-impregnated glass fiber mat |
| Silicon wafer | 76-mm diameter, lapped surface |
| Enamel paint | Alkyd automotive refinish enamel (available from E. I. duPont de Nemours under the registered trademark designation "Dulux" 93-59545) applied over tin-plated steel | sure-sensitive properties, even before exposure to actinic radiation.

The following examples are substantially the same as Example 20 except that the photoinitiator in each case was that indicated in the table, the amount being the same as in the previous examples.

TABLE III

| | | Adhesion to glass, grams/cm width | |
|---|---|---|---|
| Example | Photoinitiator | Uncured | Cured |
| 24 | $\phi_2IAsF_6$ | 616 | 1-10 |
| 25 | $\phi_2IPF_6$ | 627 | 1-10 |
| 26 | $\phi_3SSbF_5OH$ | 550 | 1-10 |
| 27 | $(CH_3\phi)_2ISbF_6$ | 638 | 1-10 |
| 28 | $\phi_3SSbF_6$ | 572 | 1-10 |

The following examples demonstrate the practice of the invention by blending an epoxy component and a photoinitiator into a conventional normally tacky and pressure-sensitive adhesive. Because the solvent systems for the adhesive and the epoxy component differ, it is not ordinarily possible to obtain a blend which

TABLE II

| | Adhesive | | Adhesion to Various Substrates, grams/cm Width | | | | | | | | | |
|---|---|---|---|---|---|---|---|---|---|---|---|---|
| | | Epoxy | | | | | Printed | | | | | |
| | % | Equivalent | Glass | | Aluminum | | Circuit Board | | Silicon Wafer | | Enamel | |
| Example | GMA | Weight | Uncured | Cured | Uncured | Cured | Uncured | Cured | Uncured | Cured | Uncured | Cured |
| 16 (Comparison) | 5 | 2857 | 1120 | 207 | 605 | 196 | 717 | 274 | — | — | — | — |
| 17 (Comparison) | 10 | 1429 | 605 | 162 | 515 | 157 | 627 | 263 | 627 | 179 | 549 | 168 |
| 18 (Comparison) | 15 | 943 | 386 | 22 | 386 | 4 | 515 | 146 | 549 | 78 | 549 | 44 |
| 19 | 20 | 710 | 353 | 4 | 353 | 5 | 627 | 15 | 20 | 24 | 532 | 11 |
| 20 | 25 | 568 | 358 | 9 | 179 | 9 | 717 | 20 | 493 | 56 | 336 | 7 |
| 21 | 30 | 474 | 396 | 55 | | | | | | | | |
| 22 | 35 | 405 | 88 | 1-10 | | | | | | | | |
| 23 (Comparison) | 40 | 355 | 0 | | | | | | | | | |

Table II shows that certain pressure-sensitive adhesives reported in the prior art can be adequately detackified when placed in contact with glass and aluminum but not when in contact with the other substrates tested.

The 85:15 IOA:GMA copolymer of comparative Example 15 was prepared at 40% solids in 90:10 EtOAc:iPrOH solvent system and polymerized 18 hours at 54° C. When an attempt was made to prepare the same polymer in the manner taught in U.S. Pat. No. 3,579,490, it was found that the reaction mixture gelled at about 50–70% conversion. It is believed that the present application discloses the first successful preparation of a pressure-sensitive adhesive actually containing as much as 15% GMA.

Example 23 and comparative Example 24 demonstrate the fact that when the amount of GMA exceeds 35% (i.e., when the epoxy equivalent weight of the adhesive exceeds about 400), the adhesive lacks presremains predictably uniform over extended periods of time, e.g., a month or more. If the blended composition is coated on a sheet backing to form a tape within 2 or 3 weeks after preparation, however, satisfactory results can be achieved. Speaking in general terms, it is more difficult to obtain the same degree of detackification upon exposure to ultraviolet light that has been demonstrated in previous examples, where the epoxy component was reacted into the adhesive itself. Further, not all epoxy resins are equally effective in detackifying a given pressure-sensitive adhesive, nor are all pressure-sensitive adhesives affected to the same extent by a given epoxy resin. As a result, the most effective use of blending techniques requires some degree of experimenting in a given situation. Nevertheless, for many purposes, blending provides a simple and convenient way to take advantage of the basic inventive concept. It is, of course, also possible to blend an epoxy resin into an adhesive in which an epoxy monomer has already been reacted into the system.

In each of the blended examples tabulated below, the photoinitiator was the same as in Examples 1-15, the amount employed being 3% based on total adhesive solids. The finished tape product, prepared in accordance with previously discussed coating and drying procedures, was tested for adhesion to a glass substrate.

TABLE IV

| | Pressure-Sensitive Adhesive | | Epoxy Resin | | Parts Photo-initiator | Epoxy Equivalent Weight in Blend | Adhesive to Glass Substrate, g/cm Width | |
|---|---|---|---|---|---|---|---|---|
| Example | Type | Parts | Type | Parts | | | Uncured | Cured |
| 29 (Comparison) | 94.5:4.5 IOA:AA | 83.3 | E7818 | 16.7 | 1.67 | 988 | 437 | 90 |
| 30 | " | 77 | E332 | 23 | 2.3 | 756 | 370 | 56 |
| 31 (Comparison) | Natural rubber S115 | 41.6 41.7 | " | 16.7 | 1.67 | 1042 | 437 | 269 |
| 32 | Natural rubber Dimethyl silicone gum rubber S115 | 30.4 16.2 30.4 | " | 24 | 2.5 | 725 | 314 | 45 |
| 33 (Comparison) | Natural rubber 67:33 butadiene:acrylonitrile copolymer S115 | 20.8 25 20.8 | " | 16.6 | 3.5 | 1048 | 836 | 484 |

What is claimed is as follows:

1. Normally tacky and pressure-sensitive adhesive having an epoxy equivalent value of about 400–900 and including an effective amount of ionic photoinitiator selected from the group consisting of radiation-sensitive aromatic onium salts of Group Va or VIa; onium catalysts of Group Va, VI or VIIa, diaryl halonium salts containing Group Va metal hexafluorides and triaryl sulfonium complex salts capable of promoting the polymerization of oxirane rings, whereby said adhesive is readily detackified by exposure to actinic radiation.

2. The adhesive of claim 1 wherein the photoinitiator is an onium salt.

3. The adhesive of claim 2 wherein the onium salt is a triaryl sulfonium salt.

4. The adhesive of claim 3 wherein the triaryl sulfonium salt is a triarylsulfonium complex salt of the formula:

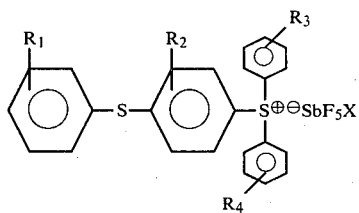

where X is F or OH and $R_1$, $R_2$, $R_3$ and $R_4$ are each selected from H, lower alkyl or halogen.

5. Sheet material to one face of which is firmly bonded a layer of the adhesive of claim 1, 2, 3 or 4.

6. The sheet material of claim 5 wherein the pressure-sensitive adhesive comprises a blend of
(a) a tacky rubbery polymer of monomers consisting essentially of
  i. about 65–80 weight percent of a monomer system which can be polymerized per se to a tacky, rubbery state and
  ii. about 35–20 weight percent of oxirane ring-containing monomers selected from the class consisting of glycidyl acrylate, glycidyl methacrylate, and glycidyl allyl ether, and
(b) an ionic photoinitiator catalyst capable of promoting the polymerization of oxirane rings,
whereby said sheet material can be applied to a desired substrate, adhering firmly thereto under normal conditions, but being readily removable therefrom after irradiation by ultraviolet light which ionically initiates the polymerization of the oxirane rings, thereby altering the adhesive structure of the polymer and reducing its adhesion to said substrate.

7. The sheet material of claim 6 wherein the polymer system consists essentially of monomers selected from the class consisting of acrylates and methacrylates.

8. The sheet material of claim 7 wherein the tacky rubbery polymer is a copolymer of iso-octyl acrylate and glycidyl methacrylate.

9. The sheet material of claim 7 wherein the tacky rubbery polymer is a copolymer of lauryl acrylate and glycidyl methacrylate.

10. The sheet material of claim 1, 2, 3 or 4 wherein the adhesive comprises a layer of normally tacky and pressure-sensitive adhesive into which is blended
(a) a resin bearing oxirane rings and
(b) an ionic photoinitiator catalyst capable of promoting the polymerization of oxirane rings,
whereby said sheet material can be applied to a desired substrate, adhering firmly thereto under normal conditions, but being readily removable therefrom after irradiation by ultraviolet light ionically initiates the polymerization of the oxirane rings, thereby altering the adhesive structure of the polymer and reducing its adhesion to said substrate.